United States Patent
Lu et al.

(10) Patent No.: US 8,125,354 B2
(45) Date of Patent: Feb. 28, 2012

(54) COMPLEX SWITCH CONTROL SYSTEM

(75) Inventors: Cheng-Cheng Lu, Sanchong (TW); Yu-Tsang Wu, Taichung (TW)

(73) Assignee: Quanta Computer Inc., Tao Yuan Shien (TW)

( * ) Notice: Subject to any disclaimer, the term of this patent is extended or adjusted under 35 U.S.C. 154(b) by 1198 days.

(21) Appl. No.: 11/898,844

(22) Filed: Sep. 17, 2007

(65) Prior Publication Data

US 2008/0297201 A1 Dec. 4, 2008

(30) Foreign Application Priority Data

Jun. 4, 2007 (TW) .................................. 96119953

(51) Int. Cl.
*H03K 9/08* (2006.01)

(52) U.S. Cl. ............... 341/22; 341/20; 341/23; 327/31; 330/278; 330/279

(58) Field of Classification Search ............. 341/20, 341/22, 21, 23; 327/31; 330/278, 279
See application file for complete search history.

(56) References Cited

U.S. PATENT DOCUMENTS

| | | | |
|---|---|---|---|
| 3,919,648 A * | 11/1975 | Uetrecht ..................... 327/555 |
| 4,405,918 A * | 9/1983 | Wall et al. ..................... 341/26 |
| 4,918,634 A | 4/1990 | Nishimori | |
| 5,027,083 A * | 6/1991 | Kutzavitch et al. ........... 330/284 |
| 5,508,700 A * | 4/1996 | Taylor et al. ..................... 341/33 |
| 5,703,473 A | 12/1997 | Phillips et al. | |
| 5,781,456 A * | 7/1998 | Dodd ............................ 702/123 |
| 6,169,765 B1 * | 1/2001 | Holcombe ..................... 375/238 |
| 6,377,051 B1 * | 4/2002 | Tyner et al. ..................... 324/418 |
| 6,777,953 B2 * | 8/2004 | Blades ........................... 324/532 |
| 6,856,127 B1 * | 2/2005 | Ramesh et al. ................ 324/102 |
| 6,927,579 B2 * | 8/2005 | Blades ........................... 324/536 |
| 7,342,385 B2 * | 3/2008 | Capodivacca et al. ........ 323/272 |
| 7,508,178 B2 * | 3/2009 | McDonald et al. ........... 323/271 |
| 7,679,447 B2 * | 3/2010 | Oishi ............................ 330/284 |
| 2003/0128563 A1 * | 7/2003 | Rojas Romero ................ 363/89 |
| 2003/0201780 A1 * | 10/2003 | Blades ........................... 324/523 |

FOREIGN PATENT DOCUMENTS

| CN | 1261174 A | 7/2000 |
| CN | 1763699 A | 4/2006 |

\* cited by examiner

*Primary Examiner* — Albert Wong
*Assistant Examiner* — Amine Benlagsir
(74) *Attorney, Agent, or Firm* — Rabin & Berdo, P.C.

(57) ABSTRACT

A complex switch control system including many switches, a switching voltage control circuit and a comparator is provided. The switching voltage control circuit converts an operating voltage into a switching voltage according to the states of the switches. The comparator compares the switching voltage with a reference voltage and outputs a switch state signal to a keyboard controller. A duty cycle of the switch state signal corresponds to the states of the switches.

8 Claims, 2 Drawing Sheets

COMPLEX SWITCH CONTROL SYSTEM

This application claims the benefit of Taiwan application Serial No. 96119953, filed Jun. 4, 2007, the subject matter of which is incorporated herein by reference.

BACKGROUND OF THE INVENTION

1. Field of the Invention

The invention relates in general to a complex switch control system, and more particularly to a complex switch control system capable of saving the number of general purpose input/output (GPIO) pins.

2. Description of the Related Art

Along with the advance in the technology of notebook computer, more and more accessory functions are added, and the number of function buttons increases accordingly. Most of the buttons of a notebook computer are coupled to a general purpose input/output (GPIO) pin of the keyboard controller via a switch for processing the instructions. That is, each button corresponds to a GPIO pin. For example, eight buttons require eight GPIO pins. Thus, as the number of buttons grows, the hardware cost will increase accordingly. Furthermore, there will be excessive number of accompanied wiring, making the overall circuit layout of notebook computer even more complicated.

SUMMARY OF THE INVENTION

The invention is directed to a complex switch control system which generates switch state signals having different duty cycles by a simple circuit for enabling the keyboard controller to determine states of many switches according to a general purpose input/output (GPIO) pin.

According to a first aspect of the present invention, a complex switch control system including many switches, a switching voltage control circuit and a comparator is provided. The switching voltage control circuit converts an operating voltage into a switching voltage according to the states of the switches. The comparator compares the switching voltage with a reference voltage and outputs a switch state signal to a keyboard controller. A duty cycle of the switch state signal corresponds to the states of the switches.

The invention will become apparent from the following detailed description of the preferred but non-limiting embodiments. The following description is made with reference to the accompanying drawings.

DETAILED DESCRIPTION OF THE INVENTION

The invention provides a complex switch control system which changes the duty cycle of the switch state signal by a simple circuit for enabling the keyboard controller to determine states of many switches according to a general purpose input/output (GPIO) pin.

Figure 1:
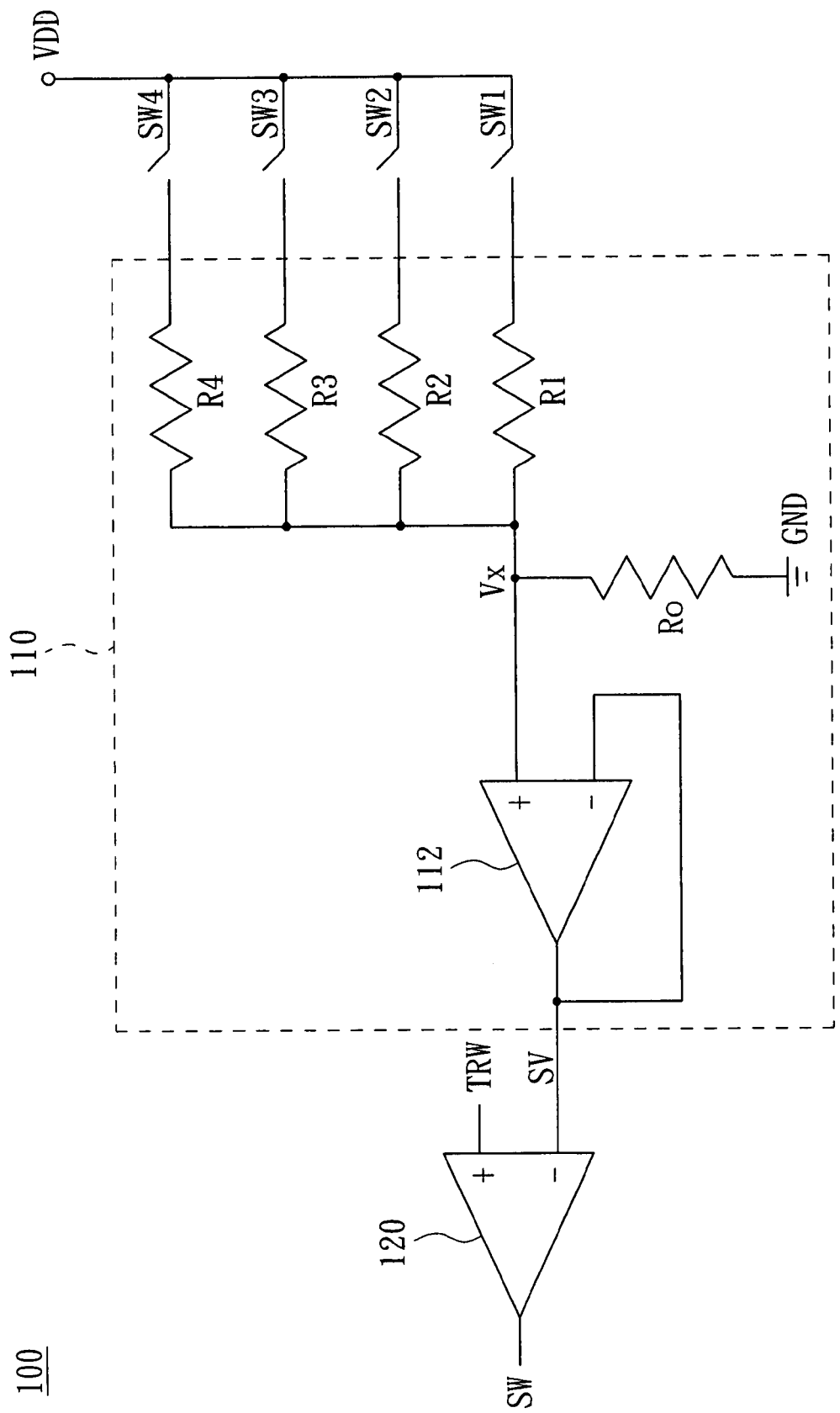
FIG. 1 is a perspective of a complex switch control system according to a preferred embodiment of the invention.

Referring to FIG. 1, a perspective of a complex switch control system according to a preferred embodiment of the invention is shown. The complex switch control system 100 comprises many switches SW1~SW4, a switching voltage control circuit 110 and a comparator 120. The first ends of the switches SW1~SW4 are all coupled to the operating voltage VDD. The switching voltage control circuit 110 converts an operating voltage VDD into a switching voltage SV according to the states of the switches SW1~SW4, that is, according to whether the switches SW1~SW4 are turned on or not. The comparator 120 is used for comparing the switching voltage SV with the reference voltage TRW and outputting a switch state signal SW to the keyboard controller (not illustrated). The duty cycle of the switch state signal SW corresponds to the states of the switches SW1~SW4.

The switching voltage control circuit 110 comprises a first switch resistor R1, a second switch resistor R2, a third switch resistor R3, a fourth switch resistor R4, a dividing resistor Ro and an operation amplifier 112. The first end of the first switch resistor R1 is coupled to the second end of the first switch SW1, the first end of the second switch resistor R2 is coupled to the second end of the second switch SW2, the first end of the third switch resistor R3 is coupled to the second end of the third switch SW3, and the first end of the fourth switch resistor R4 is coupled to the second end of the fourth switch SW4. In practical application, each switch corresponds to a switch resistor. In the present embodiment of the invention, there are four switches and four switch resistors, but the number of switches and switch resistors is not limited thereto.

The first end of the dividing resistor Ro is coupled to the second ends of the first to the fourth switch resistor R1~R4, the second end of the dividing resistor Ro is coupled to the grounding voltage GND. The first input end of the operation amplifier 112 is coupled to the first end of the dividing resistor Ro, and the second input end of the operation amplifier 112 is coupled to an output end of the operation amplifier 112 which outputs the switching voltage SV.

The first to the fourth resistor R1~R4 and the dividing resistor Ro substantially form a voltage divider, and the voltage level Vx at the first end of the dividing resistor Ro is controlled according to whether the switches SW1~SW4 are turned on. Let the operating voltage VDD be 5V, the first switch resistor R1 be 2.2K Ohm, the second switch resistor R2 be 4.7K Ohm, the third switch resistor R3 be 15K Ohm, the fourth switch resistor be 27K Ohm and the dividing resistor Ro be 2.2K Ohm. Referring to Table 1, a reference table of the states of the switches SW1~SW4 vs. the voltage level Vx is shown. In Table 1, "1" denotes that the switch is turned on.

TABLE 1

| The First Switch SW1 | The Second Switch SW2 | The Third Switch SW3 | The Fourth Switch SW4 | Voltage Level Vx (V) |
|---|---|---|---|---|
| 0 | 0 | 0 | 0 | 0 |
| 0 | 0 | 0 | 1 | 0.376712329 |
| 0 | 0 | 1 | 0 | 0.639534884 |
| 0 | 0 | 1 | 1 | 0.928829916 |
| 0 | 1 | 0 | 0 | 1.594202899 |
| 0 | 1 | 0 | 1 | 1.773291294 |
| 0 | 1 | 1 | 0 | 1.90354884 |
| 0 | 1 | 1 | 1 | 2.052292197 |
| 1 | 0 | 0 | 0 | 2.5 |
| 1 | 0 | 0 | 1 | 2.597864769 |
| 1 | 0 | 1 | 0 | 2.670807453 |
| 1 | 0 | 1 | 1 | 2.755984043 |
| 1 | 1 | 0 | 0 | 2.974137931 |
| 1 | 1 | 0 | 1 | 3.038882364 |
| 1 | 1 | 1 | 0 | 3.087772594 |
| 1 | 1 | 1 | 1 | 3.145561037 |

The operation amplifier 112 substantially forms a unit gain buffer, so the voltage level of the switching voltage SV is equal to the voltage level Vx. That is, the voltage level of the switching voltage SV changes according to whether the switches SW1~SW4 are turned on.

The comparator 120 is for comparing the switching voltage SV with the reference voltage TRW and outputting a switch state signal SW to a single general purpose input/output (GPIO) pin of the keyboard controller. The reference voltage TRW substantially is a triangle-wave signal, and the switch state signal SW substantially is squared-wave signal. When the voltage level of the switching voltage SV changes, the duty cycle of the switch state signal SW outputted by the comparator 120 also changes accordingly.

Figure 2:
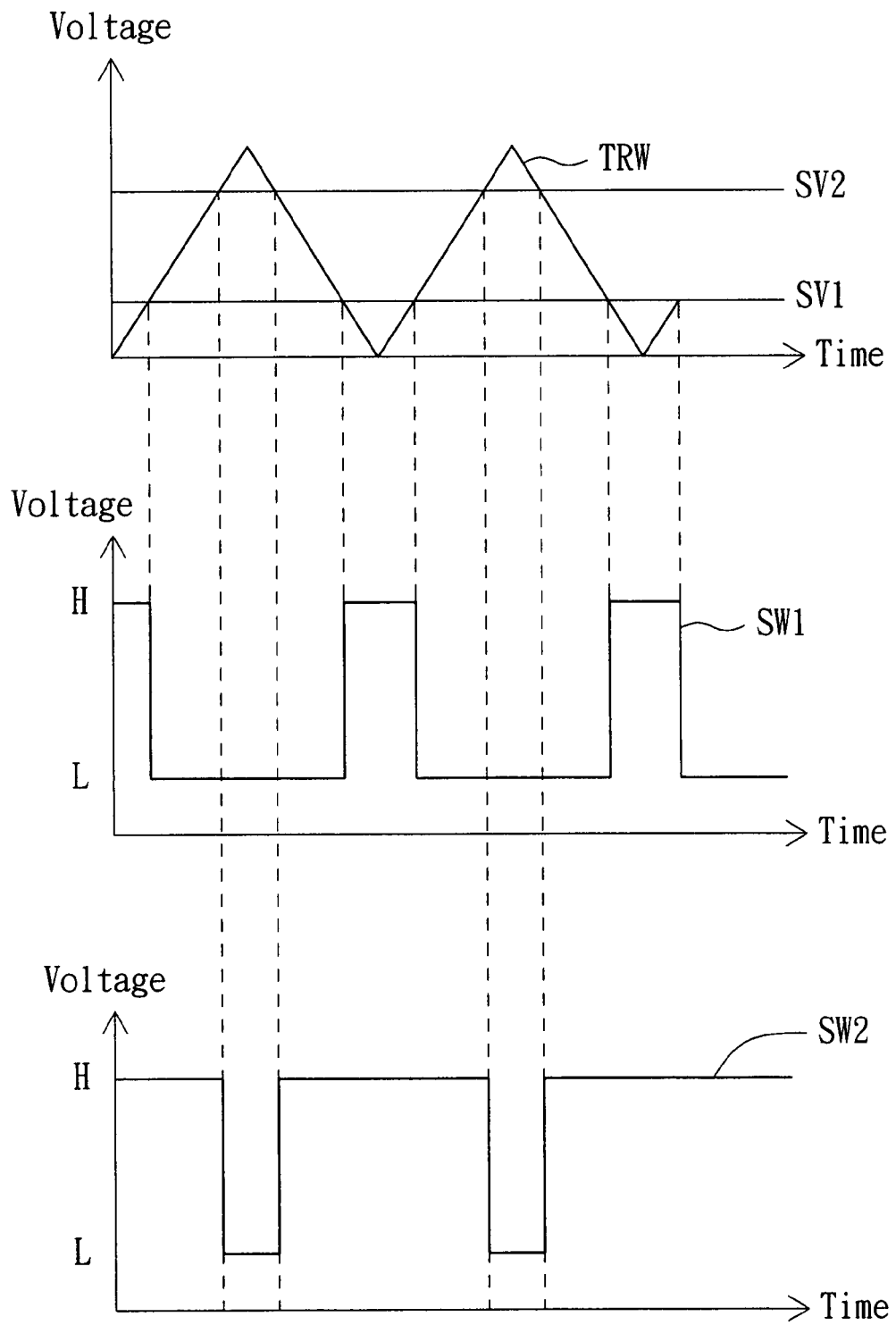
FIG. 2 is a wave diagram of a switching voltage SV, a reference voltage TRW and a switch state signal SW according to a preferred embodiment of the invention.

Referring to FIG. 2, a wave diagram of a switching voltage SV, a reference voltage TRW and a switch state signal SW according to a preferred embodiment of the invention is shown. If the switching voltage SV is the first switching voltage SV1 having a lower voltage level, the comparator 120 compares the first switching voltage SV1 with a reference voltage TRW and then outputs a first switch state signal SW1 accordingly. If the switching voltage SV is a second switching voltage SV2 having a higher voltage level, the comparator 120 compares the second switching voltage SV2 with the reference voltage TRW and then outputs a second switch state signal SW2 accordingly. As the duty cycle of the first switch state signal SW1 is different from that of the second switch state signal SW2, the keyboard controller determines the states of the switches SW1~SW4 according to the duty cycle of the switch state signal SW.

The complex switch control system disclosed in the above embodiment of the invention changes the switching voltage by a switching voltage control circuit according to states of many switches and the corresponding switch resistors thereof, and changes a duty cycle of the switch state signal by a comparator for enabling the keyboard controller to determine states of many switches according to a single GPIO pin. The states of the switches substantially correspond to whether the computer buttons are turned on or not. For example, the states of four switches disclosed in the above embodiment of the invention correspond to 16 buttons. Thus, the complex switch control system disclosed in the above embodiment of the invention largely saves the number of GPIO pins of the keyboard controller, hence reducing manufacturing cost. Besides, the switch state signal SW is outputted to the keyboard controller by way of frequency not by way of voltage as used in conventional method, so the problem of IR drop which occurs in conventional method when the route is too long can be avoided.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A complex switch control system, comprising:
   a plurality of switches;
   a switching voltage control circuit including a voltage divider, for converting an operating voltage into a switching voltage according to states of the switches; and
   a comparator for comparing the switching voltage with a reference voltage being a periodic waveform that changes value linearly, and outputting a switch state signal to a keyboard controller,
   wherein a duty cycle of the switch state signal corresponds to the states of the switches.

2. The complex switch control system according to claim 1, wherein the switch state signal is outputted to a general purpose input/output (GPIO) pin of the keyboard controller.

3. The complex switch control system according to claim 1, wherein the switches comprise:
   a first switch having a first end coupled to the operating voltage; and
   a second switch having a first end coupled to the operating voltage.

4. The complex switch control system according to claim 3, wherein the switching voltage control circuit comprises:
   a first switch resistor having a first end coupled to the second end of the first switch;
   a second switch resistor having a first end coupled to the second end of the second switch;
   a dividing resistor having a first end coupled to the second end of the first switch resistor and the second end of the second switch resistor, and a second end coupled to a grounding voltage; and
   an operation amplifier having a first end coupled to the first end of the dividing resistor and a second input end coupled to an output end of the operation amplifier which outputs the switching voltage.

5. The complex switch control system according to claim 4, wherein the voltage level of the switching voltage changes along with the states of the switches.

6. The complex switch control system according to claim 5, wherein the reference voltage is a triangle-wave signal.

7. The complex switch control system according to claim 6, wherein the switch state signal is a squared-wave signal.

8. The complex switch control system according to claim 7, wherein when the voltage level of the switching voltage changes, the duty cycle of the switch state signal changes accordingly and the keyboard controller determines the states of the switches according to the switch state signal.

* * * * *